US012021463B2

(12) United States Patent
Rohatgi

(10) Patent No.: US 12,021,463 B2
(45) Date of Patent: Jun. 25, 2024

(54) DOOR LATCH DETECTION WITH MOTOR CURRENT ANALYSIS

(71) Applicant: WHIRLPOOL CORPORATION, Benton Harbor, MI (US)

(72) Inventor: Pratyaksh Rohatgi, St. Joseph, MI (US)

(73) Assignee: WHIRLPOOL CORPORATION, Benton Harbor, MI (US)

(*) Notice: Subject to any disclaimer, the term of this patent is extended or adjusted under 35 U.S.C. 154(b) by 476 days.

(21) Appl. No.: 17/469,592

(22) Filed: Sep. 8, 2021

(65) Prior Publication Data
US 2023/0076336 A1    Mar. 9, 2023

(51) Int. Cl.
| | |
|---|---|
| H02P 7/00 | (2016.01) |
| F24C 14/02 | (2006.01) |
| F24C 15/02 | (2006.01) |
| G01R 19/00 | (2006.01) |
| H02K 17/32 | (2006.01) |
| H02K 23/68 | (2006.01) |
| H02P 21/22 | (2016.01) |
| E05B 47/00 | (2006.01) |

(52) U.S. Cl.
CPC .............. H02P 21/22 (2016.02); F24C 14/02 (2013.01); F24C 15/022 (2013.01); G01R 19/0092 (2013.01); *E05B 2047/0067* (2013.01)

(58) Field of Classification Search
CPC .... F24C 14/02; F24C 15/022; G01R 19/0092; H02P 21/22
USPC .......................................................... 318/432
See application file for complete search history.

(56) References Cited

U.S. PATENT DOCUMENTS

| | | | |
|---|---|---|---|
| 5,131,506 A | 7/1992 | Mizuno et al. | |
| 6,177,771 B1 | 1/2001 | Kinzer et al. | |
| 6,465,980 B1 | 10/2002 | Orsat | |
| 7,225,804 B2 | 6/2007 | Simmons, Jr. et al. | |
| 9,163,347 B2* | 10/2015 | Yang .................. | D06F 37/42 |
| 9,404,287 B2 | 8/2016 | Lepie | |
| 2020/0064056 A1* | 2/2020 | Hall ................... | F25D 23/12 |
| 2023/0090495 A1* | 3/2023 | Robinson ........... | C12N 15/113 |
| | | | 435/29 |

FOREIGN PATENT DOCUMENTS

KR    19970004676 B1    1/1997

* cited by examiner

*Primary Examiner* — Erick D Glass
(74) *Attorney, Agent, or Firm* — Brooks Kushman P.C.

(57) ABSTRACT

Controlling a door latch of a cooking appliance is provided. A controller monitors motor current of a motor driving a door latch during a locking operation of a door of the cooking appliance. The controller deactivates the motor responsive to the motor current reaching a closed door threshold amount of current. The controller indicates the door being in a closed state responsive to the current draw over time matching a predefined current draw curve.

20 Claims, 5 Drawing Sheets

DOOR LATCH DETECTION WITH MOTOR CURRENT ANALYSIS

TECHNICAL FIELD

Disclosed herein are approaches for door latch position detection using motor current analysis.

BACKGROUND

Ovens and other cooking appliances may include a door to a cooking cavity. When opened, the door allows a user to access the cavity. When closed, the door serves to trap heat so that food inside the cavity can cook evenly. An oven may utilize a door lock assembly to ensure that the oven door remains closed during pyrolytic cycles.

SUMMARY

In one or more illustrative examples, a method for controlling a door latch of a cooking appliance is provided. A controller monitors motor current of a motor driving a door latch during a locking operation of a door of the cooking appliance. The controller deactivates the motor responsive to the motor current reaching a closed door threshold amount of current. The controller indicates the door being in a closed state responsive to the current draw over time matching a predefined current draw curve.

In some examples, the controller may indicate an error condition responsive to the current draw over time during the locking operation failing to match a predefined current draw curve. In some examples, the controller may indicate an obstruction condition responsive to the current draw reaching the closed door threshold amount of current within a shorter timeframe than as indicated by the predefined current draw curve.

In some examples, the controller may initiate the locking operation responsive to selection of a pyrolytic cycle from a user interface of the cooking appliance. In some examples, the predefined current draw curve is an average of the current draw over time for previous cycles of the locking operation of the door. In some examples, the predefined current draw curve is preprogrammed to the controller.

In some examples, the controller may monitor the current draw of the motor driving the door latch during an unlocking operation of the door of the cooking appliance. The controller may deactivate the motor responsive to the current draw reaching an open door threshold amount of current. The controller may indicate the door being in an open state responsive to the current draw over time matching a second predefined current draw curve for opening of the door. In some examples, the controller may indicate an obstruction condition responsive to the current draw being in excess of the second predefined current draw curve for opening of the door.

In one or more illustrative examples, a system for controlling a door latch of a cooking appliance is provided. A motor is configured to drive a door latch. A current sensor is configured to measure a current draw of the motor. A controller is programmed to monitor motor current of the motor during a locking operation of a door of the cooking appliance; deactivate the motor responsive to the motor current reaching a closed door threshold amount of current; and indicate the door being in a closed state responsive to the current draw over time matching a predefined current draw curve.

In some examples, the controller is further programmed to indicate, in a user interface, an error condition responsive to the current draw over time during the locking operation failing to match the predefined current draw curve. In some examples, the controller is further programmed to indicate, in the user interface, an obstruction condition responsive to the motor current reaching the closed door threshold amount of current within a shorter timeframe than as indicated by the predefined current draw curve.

In some examples, the controller is further programmed to initiate the locking operation responsive to selection of a pyrolytic cycle from a user interface of the cooking appliance. In some examples, the predefined current draw curve is an average of the current draw over time for previous cycles of the locking operation of the door. In some examples, the predefined current draw curve is preprogrammed to a non-volatile storage of the controller.

In one or more illustrative examples, a non-transitory computer-readable medium includes instructions that, when executed by a processor of a controller of a cooking appliance, cause the cooking appliance to perform operations including to monitor motor current of a motor driving a door latch during a locking operation of a door of the cooking appliance; deactivate the motor responsive to the motor current reaching a closed door threshold amount of current; and indicate the door being in a closed state responsive to the current draw over time matching a predefined current draw curve.

In some examples, the medium further includes instructions that, when executed by the controller, cause the cooking appliance to perform operations including to indicate an error condition responsive to the current draw over time during the locking operation failing to match the predefined current draw curve. In some examples, the medium further includes instructions that, when executed by the controller, cause the cooking appliance to perform operations including to indicate an obstruction condition responsive to the current draw reaching the closed door threshold amount of current within a shorter timeframe than as indicated by the predefined current draw curve.

In some examples, the medium further includes instructions that, when executed by the controller, cause the cooking appliance to perform operations including to initiate the locking operation responsive to selection of a pyrolytic cycle from a user interface of the cooking appliance. In some examples, the predefined current draw curve is an average of the current draw over time for previous cycles of the locking operation of the door. In some examples, the predefined current draw curve is preprogrammed to the controller.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

As required, detailed embodiments of the present disclosure are disclosed herein; however, it is to be understood that the disclosed embodiments are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

An oven may utilize a door lock assembly to ensure that the oven door remains closed during pyrolytic cycles. The door lock assembly may generally include a base that supports a door latch. The door latch may define a hook that selectively engages a latch surface of the door. The door latch may be rotatable under the control of the motor between a latched position in which the hook engages the latch surface to prevent the door from opening, and an unlatched position in which the hook disengages from the latch surface to allow the door to open. Some door lock assemblies include cam components that rotate with the latch to actuate switch components to verify the position of the door lock hook. These cam and switch components increase part count, cost, and potential for latch failure.

An improved door lock assembly may use a controller to monitor the position of the door hook based on the torque applied by the motor, without use of a switch. The torque may be sensed based on measurement of the current being drawn by the motor. As the door latch pulls the door inwards, components of the oven (such as a gasket on the front frame of the door) exert opposing force on the door in the outward direction. As the hook pulls the door in, the force exerted by the oven increases, such that the torque applied by the motor increases until the door is in the latched position. This increase in current required to generate the increased torque may be monitored by the controller. By monitoring the current, the controller may determine when the current reaches a threshold indicating that the oven door is secured. Further aspects of the disclosure are provided in detail herein.

Figure 1:
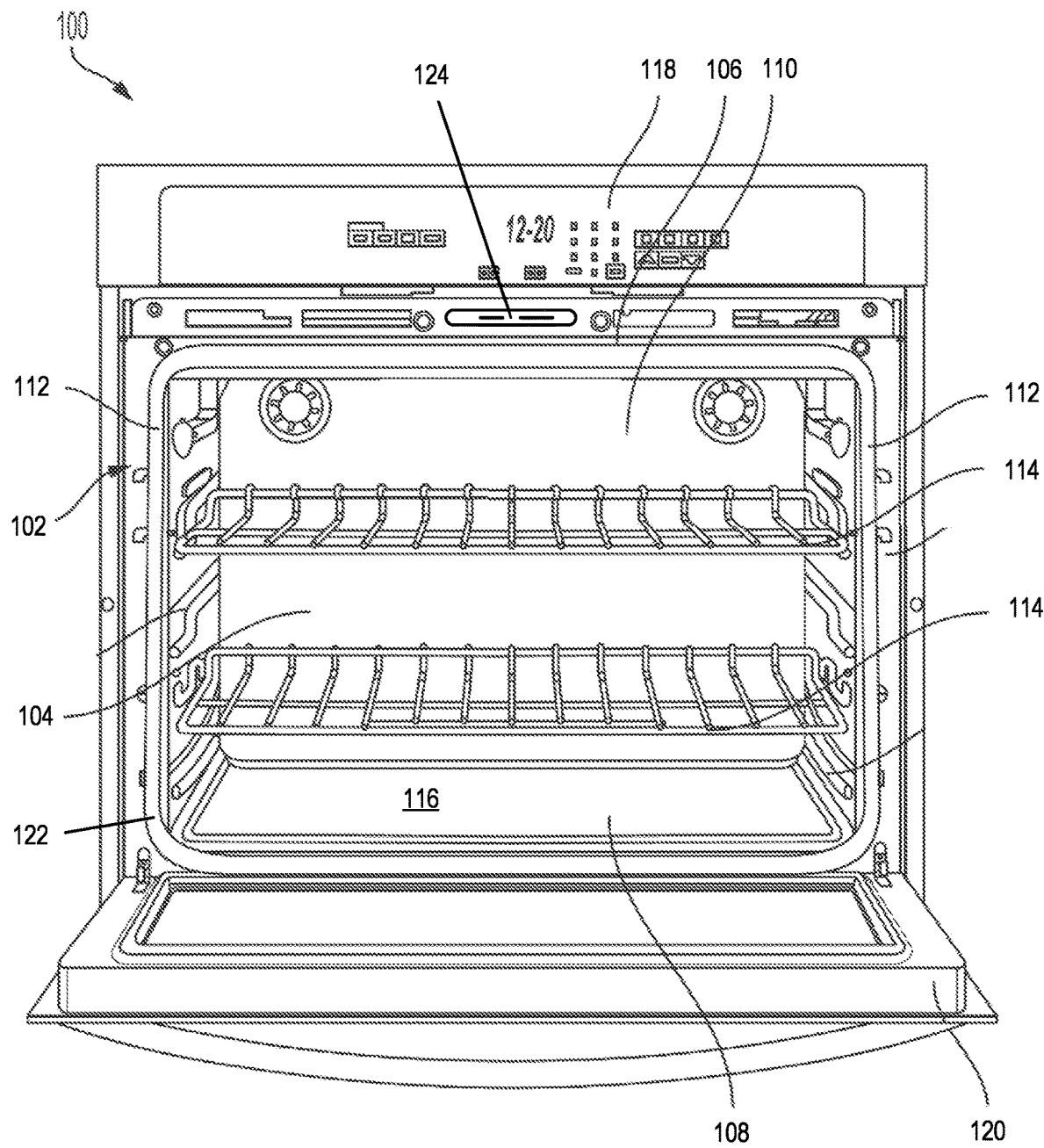
FIG. 1 illustrates an example front perspective view of an oven having a door lock assembly driven using motor current analysis.

FIG. 1 illustrates an example front perspective view of a cooking appliance 100 having a door hook driven using motor current analysis. The cooking appliance 100 may be one of various cooking appliances, such as a conventional oven, a convection oven, a conduction oven, a microwave oven, a toaster oven. In some examples, the cooking appliance 100 may be a function-specific oven, such as a roaster oven, a pizza oven, etc. The cooking appliance 100 may be standalone in some cases, while in other cases the oven may be built-in or a component of a combination oven and stove top.

The cooking appliance 100 may form a cabinet 102 which defines a cavity 104 having a cavity top 106, cavity bottom 108, cavity back 110, and side walls 112. The cavity 104 may be configured to receive food items for cooking, baking, and/or broiling during a cooking cycle. The cooking appliance 100 may include one or more racks 114 within the cavity 104 for supporting the food items during the cooking cycle.

The cooking appliance 100 may also include a heating system 116 for heating the cavity 104 during the cooking cycle. The heating system 116 may include one or more heating elements, such as a gas heating element or an electric heating element. In one example, the heating system 116 may include a first heating element at the bottom of the cavity 104, and a second heating element at the top of the cavity 104. In yet a further example, heating elements may be arranged between the cabinet 102 and the cavity back 110 and/or the cavity top 106. In addition to use in performing cooking cycles, the heating system 116 may also be used to perform a pyrolytic cycle to clean the oven cavity 104.

The cooking appliance 100 may further include a user interface 118 configured to receive user input with respect to cycles or other oven operation. The user interface 118 may also provide information to the user such as cook time, temperature, etc.

A door 120 may be hinged at a front of the cavity bottom 108 to permit access to the cavity 104. The door 120 may include a window for viewing the cavity 104 when the door 120 is closed and a handle to allow a user to open and close the door 120. The cooking appliance 100 may also include a gasket 122 to hermetically seal the cavity 104 when the door 120 is in the closed position. A door lock assembly 124 may be mounted at the top of the cavity 104.

Figure 2:
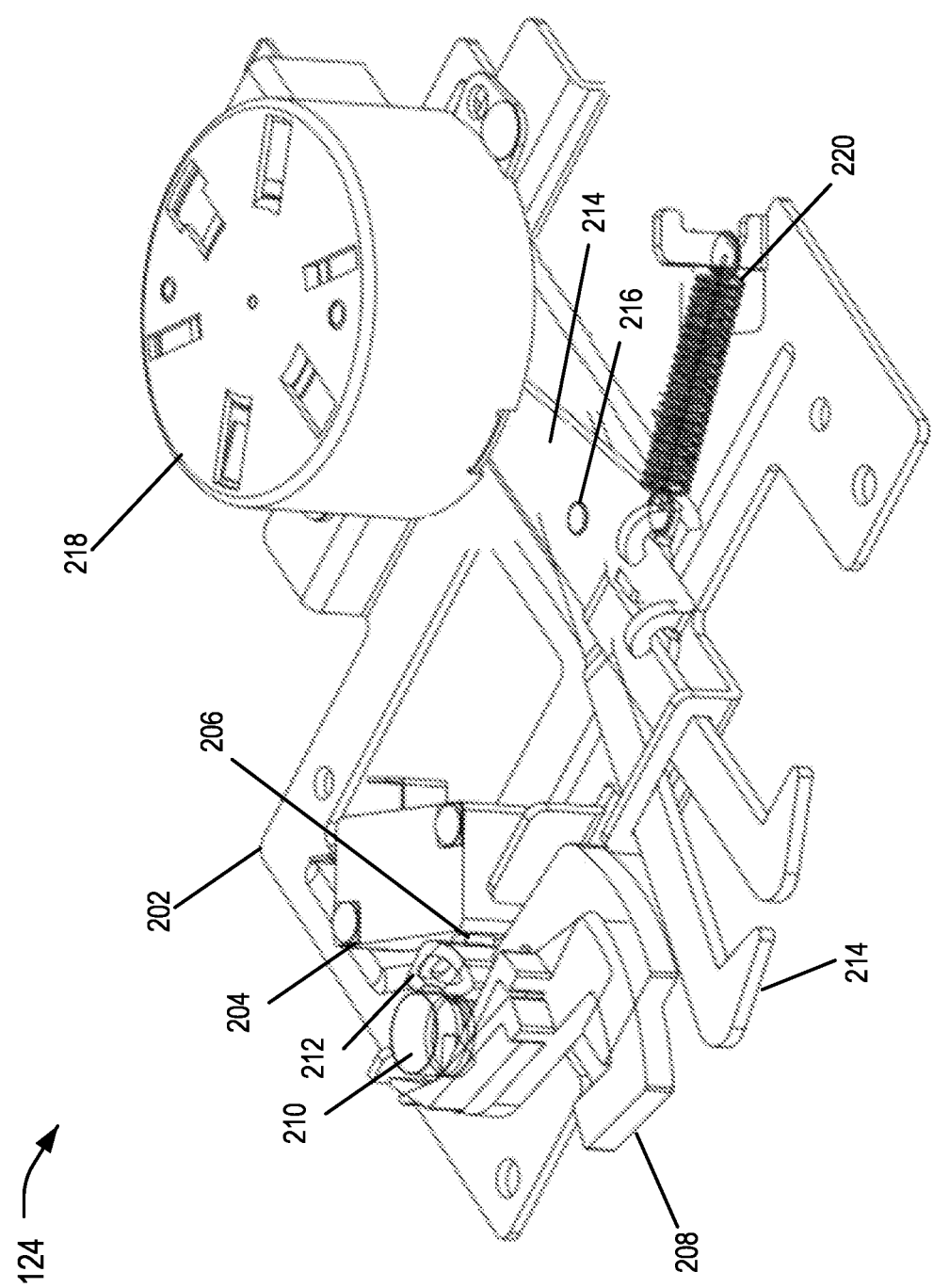
FIG. 2 illustrates an example details of a door lock assembly.

FIG. 2 illustrates example details of the door lock assembly 124. As shown in FIG. 2, and with continuing reference to FIG. 1, the door lock assembly 124 may include a base 202 that supports a door switch 204 having a button 206 which may be depressed to close the switch 204. A door sensing arm 208 may be pivotably connected at one end to the base 202. The door sensing arm 208 may be biased to rotate outwards towards the front of the cooking appliance 100 by a biasing element 210. That is, when the door is opened, the door sensing arm 208 is biased outward and away from the button 206 via the biasing element 210.

The door sensing arm 208 may further include a cam 212 or other protruding portion. When the door 120 is closed, the inner face of the door 120 comes into contact with the door sensing arm 208, which causes the door sensing arm 208 to rotate relative to the base 202. In turn, the sensing arm 208 causes the cam 212 to contact the button 206. Upon actuation, the button 206 closes the switch 204. When the door 120 is opened, the biasing element 210 moves the cam 212 away from the button 206 and the switch 204 is opened.

When the door 120 reaches its closed resting position, there may still be a small gap between the door 120 and the front of the cabinet 102. To prevent heat from escaping the cooking appliance 100, e.g., during pyrolytic cycles, it may be desirable to ensure that the door 120 is properly sealed against the cavity 104 of the cooking appliance 100. To seal the door 120, the door lock assembly 124 may further include a door latch 214 configured to pull the door 120 inwards toward the cavity 104 by a predefined distance. This distance may be, in an example, on the order of 1-5 millimeters.

The base 202 may pivotably support the door latch 214 about a pivot point 216. A motor 218 may also be supported by the base 202. In an example, the motor 218 may be a synchronous motor. In another example, the motor 218 may be an induction motor. The door latch 214 may be rotatable under the control of the motor 218 between a latched position in which the door latch 214 engages a latch surface of the oven door 120 to prevent the door 120 from opening, and an unlatched position in which the door latch 214 disengages from the latch surface to allow the oven door 120 to be opened. The latch surface of the oven door 120 may include an opening, projection, or another hook for which the door latch 214 may engage and retain when the door is in the latched position. As illustrated, the door latch 214 may form an L-shaped end. Alternative ends may also be used such as hooks, U-shaped ends, etc.

While not shown, an arm may be pivotally mounted off-center from the shaft of the motor 218 at a first end and pivotally mounted to the door latch 214 opposite the hook in a second end of the arm. A biasing element 220 may be used to bias the door latch 214 into the latched position. To close the door 120, current may be applied to the motor 218, thereby rotating the shaft and to cause the arm to pivot the door latch 214 about the pivot point 216.

Figure 3:
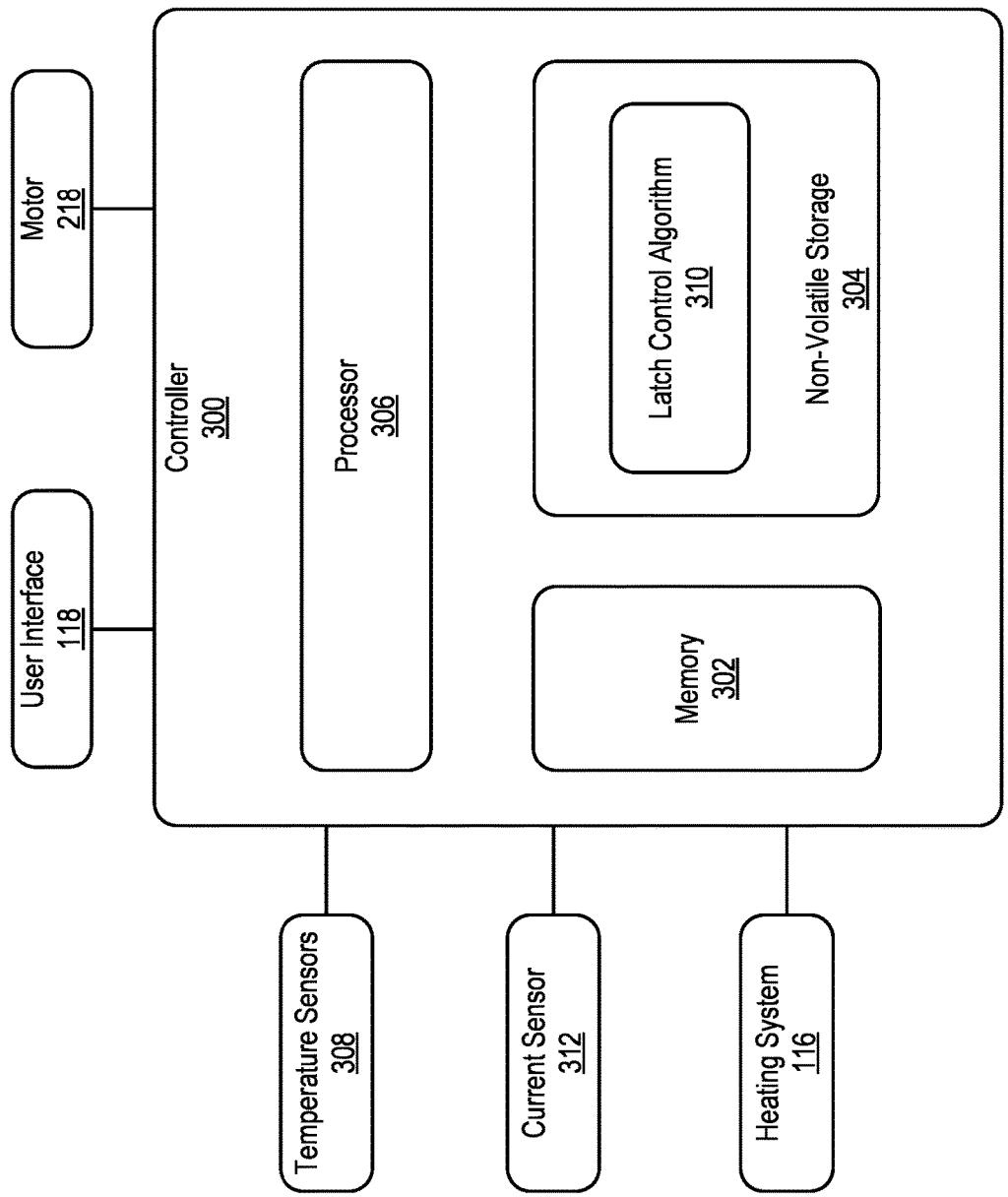
FIG. 3 illustrates an example controller configured to operate the components of the smart oven to perform door lock hook detection using motor current analysis.

FIG. 3 illustrates an example controller 300 configured to operate the components of the cooking appliance 100 to control the operation of the door lock assembly 124. The controller 300 may include a memory 302, a non-volatile storage 304, and a processor 306. The non-volatile storage 304 may store operations for a motor current analysis application 310.

The memory 302 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information. The non-volatile storage 304 may include one or more persistent data storage devices such as a hard drive, optical drive, tape drive, non-volatile solid-state device, cloud storage or any other device capable of persistently storing information.

The processor 306 may include one or more microprocessors, micro-controllers, digital signal processors, microcomputers, central processing units (CPU), graphical processing units (GPU), tensor processing units (TPU), field programmable gate arrays, programmable logic devices, state machines, logic circuits, analog circuits, digital circuits, or any other devices that manipulate signals (analog or digital) based on computer-executable instructions residing in memory 302.

The processor 306 may be configured to read into memory 302 and execute computer-executable instructions residing in the non-volatile storage 304. Upon execution by the processor 306, the computer-executable instructions may cause the cooking appliance 100 to implement one or more of the algorithms and/or methodologies disclosed herein.

The controller 300 may be electrically connected to signaling interfaces of other components of the cooking appliance 100, thereby allowing the processor 306 of the controller 300 to manipulate the functions of the cooking appliance 100. For example, the controller 300 may be configured to receive user input from the user interface 118, such as requests to initiate a cooking cycle or a pyrolytic cycle. The controller 300 may also be configured to control operation of the heating system 116, including to apply power to heating elements of the heating system 116 to warm the cavity 104, as well as to discontinue applying power to the heating element of the heating system 116.

In some door lock assemblies 124, a second switch may be used to monitor the position of the door latch 214. For instance, a cam or other protruding member may be attached to the shaft of the motor 218 that contacts a button to close of the second switch when the door latch 214 is in the latched position but does not contact the button of the second switch when the door latch 214 is unlatched position. However, such approaches require additional cam and switch components.

The controller 300 may monitor the position of the door latch 214 based on the torque applied by the motor 218. The torque may be sensed using a current sensor 312 configured to measure the current being drawn by the motor 218. As some examples, the current sensor 312 may be a shunt resistor, a current transformer, a hall effect sensor, etc. As the door latch 214 pulls the door 120 inwards, the gasket 122 exerts force on the door 120 in the outward direction. Due to the increase in required force, the torque applied by the motor 218 increases until the door 120 is in the fully latched position. While discussed in more detail below, the controller 300 may activate and deactivate the motor 218 based on a current draw over time, e.g., powering the motor 218 until the amount of current measured by the current sensor 312 bring drawn reaches a threshold amount of current indicative of a latched state.

The controller 300 may accordingly utilize a latch control algorithm 308 to control the door lock assembly 124 to selectively control the motor 218 of the door lock assembly 124. Instead of using a physical switch, the controller 300 may instead determine whether the door latch 214 is in the latched position based on the current being drawn by the motor 218. Thus, the use of switch and cam components to verify the position of the door latch 214 may be avoided.

Figure 4:
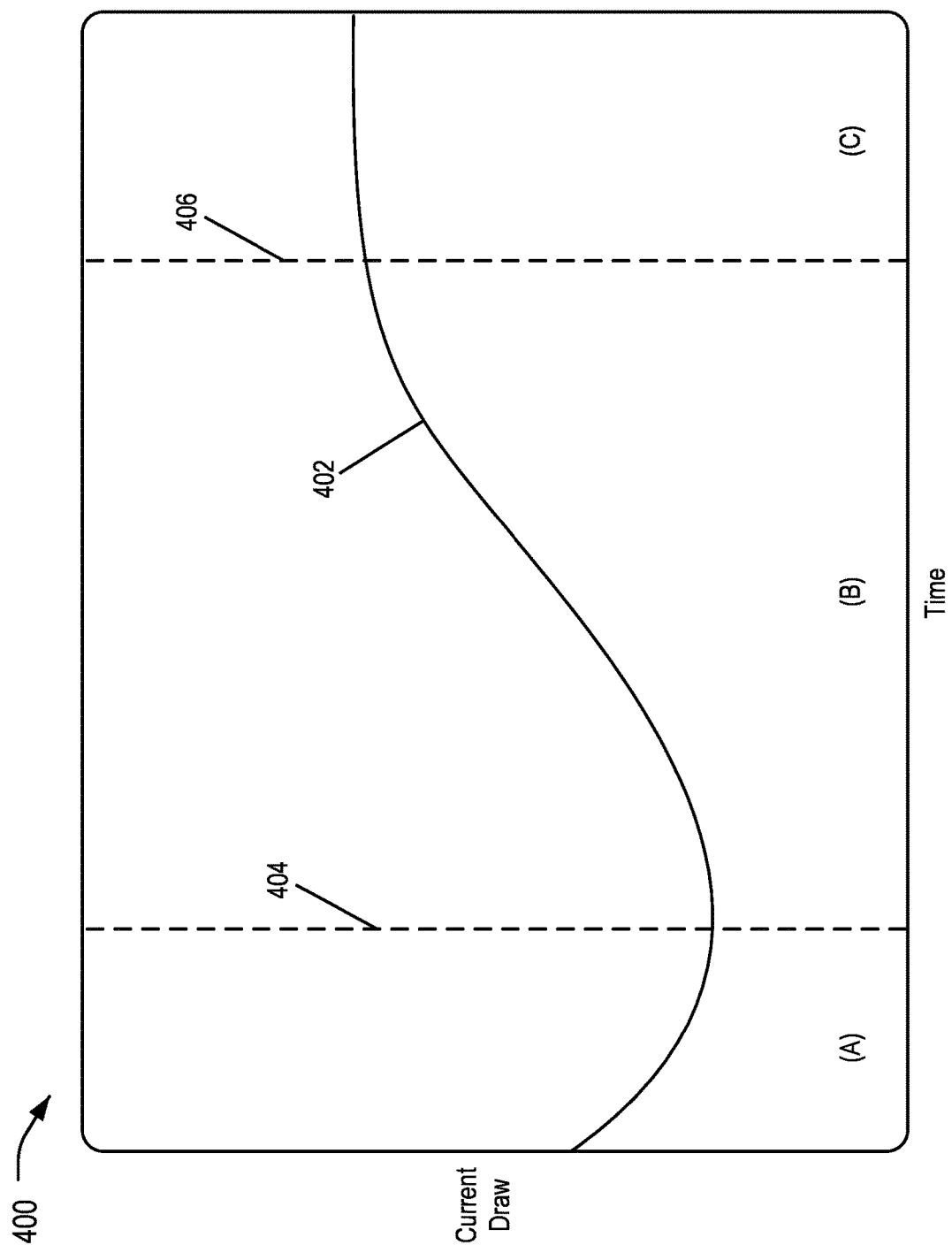
FIG. 4 illustrates an example graph of current draw of the motor over time for an example closure of the oven door.

FIG. 4 illustrates an example graph 400 of current draw 402 of the motor 218 over time for an example closure of the oven door 120. The Y-Axis of the graph 400 represents the current draw 402 measured by the current sensor 312, while the X-Axis represents time. As shown, the current draw 402 begins with a first region (A), in which the current decreases from an initial startup torque until an inflection point 404. Next, the current draw 402 increases in a second region (B) as the door latch 214 pulls the door 120 inwards and the gasket 122 exerts increasing force on the door 120 in the outward direction. Finally, the current draw 402 levels off beginning at a close threshold 406 defining a third region (C) responsive to closure of the oven door 120.

Figure 5:
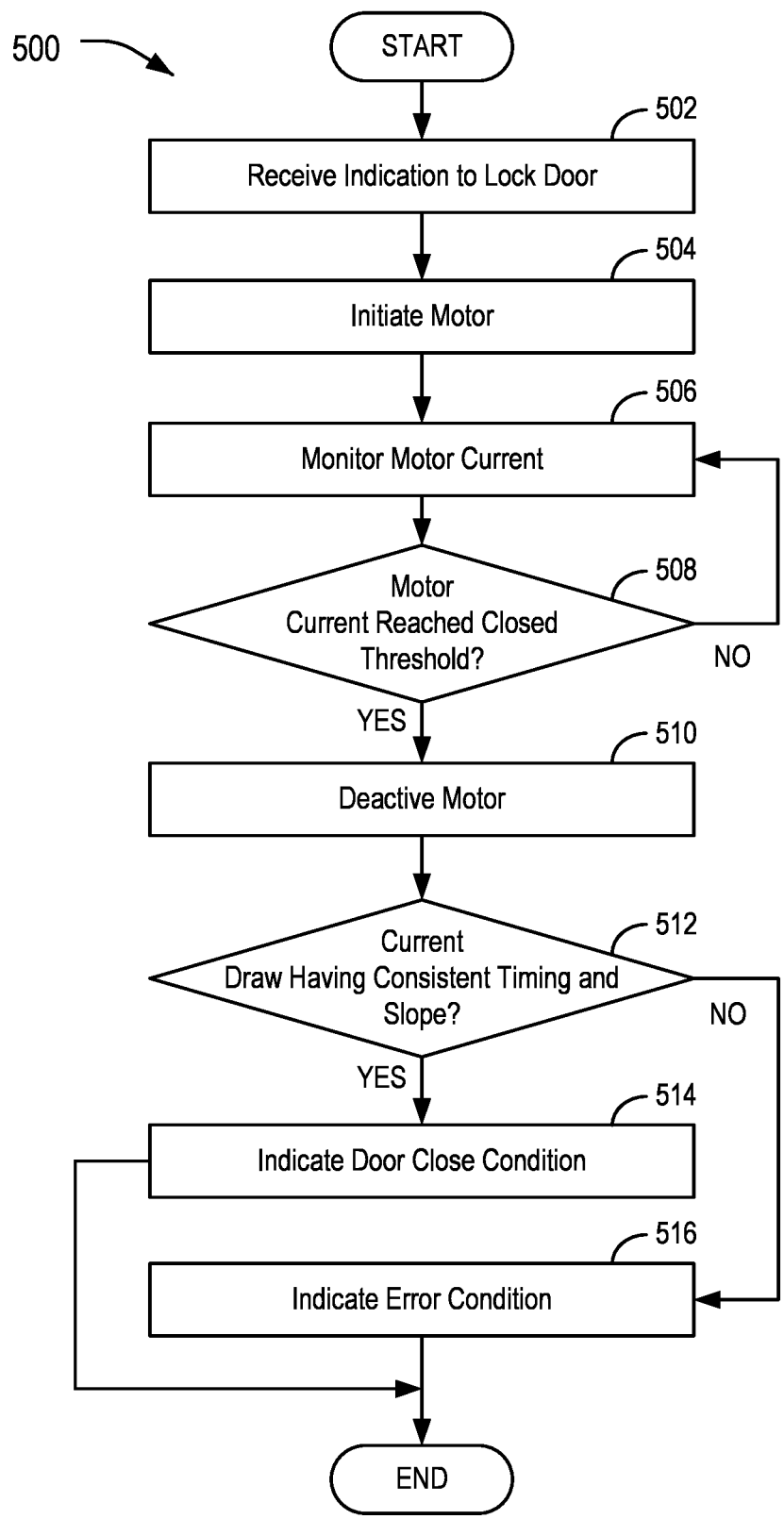
FIG. 5 illustrates an example process for the use of the controller to control the motor of the door lock assembly.

FIG. 5 illustrates an example process 500 for the use of the controller 300 to control the motor 218 of the door lock assembly 124. In an example, the process 500 may be performed by execution of the latch control algorithm 308 as executed by the processor 306 of the controller 300 of the cooking appliance 100. The process 500 may be initiated at operation 502, for example, by receipt of an indication of a user selecting a pyrolytic cycle from the user interface 118.

At operation 504, the controller 300 initiates operation of the motor 218. In an example, the controller 300 activates a relay or other switch to provide current to the motor 218. At operation 506, the controller 300 monitors the current draw 402 of the motor 218. For instance, the controller 300 may receive a signal from a current transducer to allow for the monitoring of the instantaneous current being drawn by the motor 218. While shown as a discrete operation in the process 500, it should be noted that controller 300 continuously monitors the current draw 402 of the motor 218 throughout the control of the process 500 for performing the door 120 close operation.

At operation 508, the controller 300 determines whether the current draw 402 has reached the close threshold 406. In an example, the controller 300 may continue to monitor the current until the current draw 402 reaches the close threshold 406 as shown in FIG. 4. If so, control passes to operation 510 to deactivate the motor 218. Otherwise, the control returns to operation 506 to continue operating and monitoring the motor 218.

Following operation 510, at operation 512 the controller 300 optionally determines whether the current draw 402 of the motor 218 over the course of the close operation has consistent timing and slope with respect to historical or predefined motor 218 operation. For instance, if the current draw 402 of the motor 218 reaches a high current draw 402 faster than historical or predefined motor 218 operation, the controller 300 may infer that there is an obstruction preventing the door 120 from becoming fully latched. If the current draw 402 matches normal operation, control passes to operation 514 to indicate door 120 closure. If not, control passes to operation 516 to indicate an error condition.

At operation 514, the controller 300 indicates a door 120 close condition. For instance, the controller 300 may activate a locked light, sound, or other indicator in the user interface 118. In another example, the controller 300 may allow the cooking appliance 100 to proceed with the pyrolytic cycle. After operation 514, the process 500 ends.

At operation 516, the controller 300 indicates a door 120 error condition. For instance, the controller 300 may activate a light, sound, or other indicator in the user interface 118 indicating an obstruction or other possible issue with the closure of the door 120. In such an example, the controller 300 may prevent the cooking appliance 100 from proceeding with the pyrolytic cycle. After operation 516, the process 500 ends.

Thus, by monitoring the position of the door latch 214 based on the torque applied via motor 218 determined based on the motor current, the locked state of the door 120 may be determined without use of additional switch and cam components. Accordingly, part count, cost, and potential for latch failure may be reduced, while at the same time providing for confirmation of proper door 120 closure.

It should also be noted that while the aforementioned techniques are described with respect to a latch operation, a similar approach may be used for an unlatch operation. For instance, in an unlock operation the controller 300 may monitor the position of the door latch 214 based on the torque applied via motor 218 as determined based on the motor current. The controller 300 may ensure that the applied torque matches a torque curve for a typical unlock cycle to identify when the door 120 is properly unlatched. If, for example, there is an anomaly such as an unexpectedly high current draw 402, the controller 300 may infer that there is an obstruction preventing the door 120 from becoming fully latched and may raise an alert.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

The flowcharts and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for controlling a door latch of a cooking appliance, comprising:
   monitoring, by a controller, current draw of a motor driving a door latch during a locking operation of a door of the cooking appliance;
   deactivating, by the controller, the motor responsive to the current draw reaching a closed door threshold amount of current; and
   indicating, by the controller, the door being in a closed state responsive to the current draw over time matching a predefined current draw curve.

2. The method of claim 1, further comprising indicating, by the controller, an error condition responsive to the current draw over time during the locking operation failing to match a predefined current draw curve.

3. The method of claim 2, further comprising indicating an obstruction condition responsive to the current draw reaching the closed door threshold amount of current within a shorter timeframe than as indicated by the predefined current draw curve.

4. The method of claim 1, further comprising initiating the locking operation responsive to selection of a pyrolytic cycle from a user interface of the cooking appliance.

5. The method of claim 1, wherein the predefined current draw curve is an average of the current draw over time for previous cycles of the locking operation of the door.

6. The method of claim 1, wherein the predefined current draw curve is preprogrammed to the controller.

7. The method of claim 1, further comprising:
   monitoring, by the controller, the current draw of the motor driving the door latch during an unlocking operation of the door of the cooking appliance;
   deactivating, by the controller, the motor responsive to the current draw reaching an open door threshold amount of current; and
   indicating, by the controller, the door being in an open state responsive to the current draw over time matching a second predefined current draw curve for opening of the door.

8. The method of claim 7, further comprising indicating an obstruction condition responsive to the current draw being in excess of the second predefined current draw curve for opening of the door.

9. A system for controlling a door latch of a cooking appliance, comprising:
   a motor configured to drive a door latch;
   a current sensor configured to measure current draw of the motor; and
   a controller programmed to
      monitor motor current of the motor during a locking operation of a door of the cooking appliance,
      deactivate the motor responsive to the motor current reaching a closed door threshold amount of current, and indicate the door being in a closed state responsive to the current draw over time matching a predefined current draw curve.

10. The system of claim 9, wherein the controller is further programmed to indicate, in a user interface, an error condition responsive to the current draw over time during the locking operation failing to match the predefined current draw curve.

11. The system of claim 10, wherein the controller is further programmed to indicate, in the user interface, an obstruction condition responsive to the motor current reaching the closed door threshold amount of current within a shorter timeframe than as indicated by the predefined current draw curve.

12. The system of claim 9, wherein the controller is further programmed to initiate the locking operation responsive to selection of a pyrolytic cycle from a user interface of the cooking appliance.

13. The system of claim 9, wherein the predefined current draw curve is an average of the current draw over time for previous cycles of the locking operation of the door.

14. The system of claim 9, wherein the predefined current draw curve is preprogrammed to a non-volatile storage of the controller.

15. A non-transitory computer-readable medium comprising instructions that, when executed by a processor of a controller of a cooking appliance, cause the cooking appliance to perform operations including to:

monitor current draw of a motor driving a door latch during a locking operation of a door of the cooking appliance;

deactivate the motor responsive to the current draw reaching a closed door threshold amount of current; and indicate the door being in a closed state responsive to the current draw over time matching a predefined current draw curve.

16. The medium of claim 15, further comprising instructions that, when executed by the controller, cause the cooking appliance to perform operations including to indicate an error condition responsive to the current draw over time during the locking operation failing to match the predefined current draw curve.

17. The medium of claim 16, further comprising instructions that, when executed by the controller, cause the cooking appliance to perform operations including to indicate an obstruction condition responsive to the current draw reaching the closed door threshold amount of current within a shorter timeframe than as indicated by the predefined current draw curve.

18. The medium of claim 15, further comprising instructions that, when executed by the controller, cause the cooking appliance to perform operations including to initiate the locking operation responsive to selection of a pyrolytic cycle from a user interface of the cooking appliance.

19. The medium of claim 15, wherein the predefined current draw curve is an average of the current draw over time for previous cycles of the locking operation of the door.

20. The medium of claim 15, wherein the predefined current draw curve is preprogrammed to the controller.

* * * * *